United States Patent
Ho (10) Patent No.: US 9,113,550 B2
(45) Date of Patent: Aug. 18, 2015

(54) APPARATUS FOR AN EMP SHIELD FOR PORTABLE DEVICES

(71) Applicant: Joel Ho, Saratoga, CA (US)

(72) Inventor: Joel Ho, Saratoga, CA (US)

(*) Notice: Subject to any disclaimer, the term of this patent is extended or adjusted under 35 U.S.C. 154(b) by 62 days.

(21) Appl. No.: 13/923,302

(22) Filed: Jun. 20, 2013

(65) Prior Publication Data

US 2014/0284094 A1  Sep. 25, 2014

Related U.S. Application Data

(60) Provisional application No. 61/804,382, filed on Mar. 22, 2013.

(51) Int. Cl.
*H05K 9/00* (2006.01)

(52) U.S. Cl.
CPC ............ *H05K 9/0094* (2013.01); *H05K 9/0043* (2013.01)

(58) Field of Classification Search
CPC .................................................... H05K 9/0043
USPC ........................................................ 174/378
See application file for complete search history.

(56) References Cited

U.S. PATENT DOCUMENTS

| | | | | |
|---|---|---|---|---|
| 4,785,136 A * | 11/1988 | Mollet et al. | ................... | 174/363 |
| 5,136,119 A * | 8/1992 | Leyland | ........................ | 174/379 |
| 5,329,422 A | 7/1994 | Sasaki | | |
| 5,545,844 A * | 8/1996 | Plummer et al. | ............... | 174/379 |
| 5,627,731 A | 5/1997 | Sato et al. | | |
| 5,910,883 A | 6/1999 | Cipolla et al. | | |
| 5,965,842 A | 10/1999 | Ganninger et al. | | |
| 6,049,469 A | 4/2000 | Hood, III et al. | | |
| 6,297,956 B1 | 10/2001 | Janik et al. | | |
| 7,342,783 B2 | 3/2008 | Park | | |
| 8,067,701 B2 | 11/2011 | Keiper et al. | | |
| 2003/0007323 A1 | 1/2003 | Huang et al. | | |
| 2005/0083649 A1* | 4/2005 | Behrens et al. | ............... | 361/687 |
| 2005/0265012 A1* | 12/2005 | Hendrickson | ................. | 361/818 |
| 2006/0044206 A1* | 3/2006 | Moskowitz et al. | .......... | 343/841 |
| 2007/0246208 A1 | 10/2007 | Tsukamoto | | |
| 2008/0268924 A1* | 10/2008 | Chang | ........................ | 455/575.5 |
| 2009/0009947 A1 | 1/2009 | Lam et al. | | |
| 2010/0270070 A1* | 10/2010 | Bradley | ........................ | 174/378 |
| 2011/0128663 A1 | 6/2011 | Horiuchi et al. | | |
| 2012/0114270 A1* | 5/2012 | Roberts | ........................ | 383/109 |
| 2012/0195530 A1* | 8/2012 | Kennedy | ........................ | 383/107 |
| 2012/0228020 A1* | 9/2012 | Winch et al. | ................... | 174/378 |
| 2012/0285737 A1* | 11/2012 | Judy et al. | ...................... | 174/381 |
| 2013/0220694 A1* | 8/2013 | Wittman-Holloway et al. | ............................. | 174/378 |
| 2014/0009004 A1* | 1/2014 | Schroeder et al. | ............ | 307/326 |

* cited by examiner

*Primary Examiner* — Hung V Ngo
(74) *Attorney, Agent, or Firm* — Ariel S. Bentolila; Bay Area IP Group LLC (57) ABSTRACT

An apparatus comprises an electrically conductive sheet material having a transparency. The sheet material being flexible to fold to form a pouch configured to enclose a portable computing device. The sheet material is configured to seal side edges of the pouch with edges of the sheet being in electrical engagement. A sealing member is configured to close an opening of the pouch to enclose the portable computing device within the pouch. The closure member is further configured to create an electrical engagement across the opening of the pouch in which the closed pouch structure mitigates electro-magnetic pulse damage and radio waves in general to the enclosed portable computing device, enables viewing of displays of the enclosed portable computing device, and enables manipulation of controls of the enclosed portable computing device while allowing access through wireless to the outside world.

20 Claims, 5 Drawing Sheets

APPARATUS FOR AN EMP SHIELD FOR PORTABLE DEVICES

CROSS-REFERENCE TO RELATED APPLICATIONS

The present Utility patent application claims priority benefit of the U.S. provisional application for patent Ser. No. 61/804,382, entitled "High-Altitude EMP Shield for Electronics", filed on 22 Mar. 2013, under 35 U.S.C. 119(e). The contents of this related provisional application are incorporated herein by reference for all purposes to the extent that such subject matter is not inconsistent herewith or limiting hereof.

FEDERALLY SPONSORED RESEARCH OR DEVELOPMENT

Not applicable.

REFERENCE TO SEQUENCE LISTING, A TABLE, OR A COMPUTER LISTING APPENDIX

Not applicable.

COPYRIGHT NOTICE

A portion of the disclosure of this patent document contains material that is subject to copyright protection. The copyright owner has no objection to the facsimile reproduction by anyone of the patent document or patent disclosure as it appears in the Patent and Trademark Office, patent file or records, but otherwise reserves all copyright rights whatsoever.

FIELD OF THE INVENTION

One or more embodiments of the invention generally relate to device protection. More particularly, the invention relates to device protection through use of protective coverings.

BACKGROUND OF THE INVENTION

The following background information may present examples of specific aspects of the prior art (e.g., without limitation, approaches, facts, or common wisdom) that, while expected to be helpful to further educate the reader as to additional aspects of the prior art, is not to be construed as limiting the present invention, or any embodiments thereof, to anything stated or implied therein or inferred thereupon.

Many devices, particularly electronic devices, may be susceptible to damages caused by electromagnetic pulses, solar flares, and other disturbances. However, many available solutions are not suitable for use with portable devices.

One known solution shows a structural frame for a portable computer that is made of a metal material for shielding and absorbing electromagnetic interference and for strengthening the structure of the portable computer. Another known solution teaches of a heat release sheet for shielding electromagnetic wave generating from an electronics device. Yet another known solution discloses of a housing for a computing device in which an electromagnetic interference shield is able to limit electromagnetic emission from a display apparatus. However, these solutions are inefficient for use by owners of small portable devices. A solution that provided protection from electromagnetic disturbances which could be easily incorporated and substantially mobile would be desirable.

In view of the foregoing, it is clear that these traditional techniques are not perfect and leave room for more optimal approaches.

BRIEF DESCRIPTION OF THE DRAWINGS

The present invention is illustrated by way of example, and not by way of limitation, in the figures of the accompanying drawings and in which like reference numerals refer to similar elements and in which.

Unless otherwise indicated illustrations in the figures are not necessarily drawn to scale.

DETAILED DESCRIPTION OF SOME EMBODIMENTS

The present invention is best understood by reference to the detailed figures and description set forth herein.

Embodiments of the invention are discussed below with reference to the Figures. However, those skilled in the art will readily appreciate that the detailed description given herein with respect to these figures is for explanatory purposes as the invention extends beyond these limited embodiments. For example, it should be appreciated that those skilled in the art will, in light of the teachings of the present invention, recognize a multiplicity of alternate and suitable approaches, depending upon the needs of the particular application, to implement the functionality of any given detail described herein, beyond the particular implementation choices in the following embodiments described and shown. That is, there are numerous modifications and variations of the invention that are too numerous to be listed but that all fit within the scope of the invention. Also, singular words should be read as plural and vice versa and masculine as feminine and vice versa, where appropriate, and alternative embodiments do not necessarily imply that the two are mutually exclusive.

It is to be further understood that the present invention is not limited to the particular methodology, compounds, materials, manufacturing techniques, uses, and applications, described herein, as these may vary. It is also to be understood that the terminology used herein is used for the purpose of describing particular embodiments only, and is not intended to limit the scope of the present invention. It must be noted that as used herein and in the appended claims, the singular forms "a," "an," and "the" include the plural reference unless the context clearly dictates otherwise. Thus, for example, a reference to "an element" is a reference to one or more elements and includes equivalents thereof known to those skilled in the art. Similarly, for another example, a reference to "a step" or "a means" is a reference to one or more steps or means and may include sub-steps and subservient means. All conjunctions used are to be understood in the most inclusive sense possible. Thus, the word "or" should be understood as having the definition of a logical "or" rather than that of a logical "exclusive or" unless the context clearly necessitates otherwise. Structures described herein are to be understood also to refer to functional equivalents of such structures. Language that may be construed to express approximation should be so understood unless the context clearly dictates otherwise.

Unless defined otherwise, all technical and scientific terms used herein have the same meanings as commonly understood by one of ordinary skill in the art to which this invention belongs. Preferred methods, techniques, devices, and materials are described, although any methods, techniques, devices, or materials similar or equivalent to those described herein may be used in the practice or testing of the present invention. Structures described herein are to be understood also to refer to functional equivalents of such structures. The present invention will now be described in detail with reference to embodiments thereof as illustrated in the accompanying drawings.

From reading the present disclosure, other variations and modifications will be apparent to persons skilled in the art. Such variations and modifications may involve equivalent and other features which are already known in the art, and which may be used instead of or in addition to features already described herein.

Although Claims have been formulated in this Application to particular combinations of features, it should be understood that the scope of the disclosure of the present invention also includes any novel feature or any novel combination of features disclosed herein either explicitly or implicitly or any generalization thereof, whether or not it relates to the same invention as presently claimed in any Claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The Applicants hereby give notice that new Claims may be formulated to such features and/or combinations of such features during the prosecution of the present Application or of any further Application derived therefrom.

References to "one embodiment," "an embodiment," "example embodiment," "various embodiments," etc., may indicate that the embodiment(s) of the invention so described may include a particular feature, structure, or characteristic, but not every embodiment necessarily includes the particular feature, structure, or characteristic. Further, repeated use of the phrase "in one embodiment," or "in an exemplary embodiment," do not necessarily refer to the same embodiment, although they may.

Headings provided herein are for convenience and are not to be taken as limiting the disclosure in any way.

The enumerated listing of items does not imply that any or all of the items are mutually exclusive, unless expressly specified otherwise.

The terms "a", "an" and "the" mean "one or more", unless expressly specified otherwise.

Devices or system modules that are in at least general communication with each other need not be in continuous communication with each other, unless expressly specified otherwise. In addition, devices or system modules that are in at least general communication with each other may communicate directly or indirectly through one or more intermediaries.

A description of an embodiment with several components in communication with each other does not imply that all such components are required. On the contrary a variety of optional components are described to illustrate the wide variety of possible embodiments of the present invention.

As is well known to those skilled in the art many careful considerations and compromises typically must be made when designing for the optimal manufacture of a commercial implementation any system, and in particular, the embodiments of the present invention. A commercial implementation in accordance with the spirit and teachings of the present invention may configured according to the needs of the particular application, whereby any aspect(s), feature(s), function(s), result(s), component(s), approach(es), or step(s) of the teachings related to any described embodiment of the present invention may be suitably omitted, included, adapted, mixed and matched, or improved and/or optimized by those skilled in the art, using their average skills and known techniques, to achieve the desired implementation that addresses the needs of the particular application.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate or interact with each other.

It is to be understood that any exact measurements/dimensions or particular construction materials indicated herein are solely provided as examples of suitable configurations and are not intended to be limiting in any way. Depending on the needs of the particular application, those skilled in the art will readily recognize, in light of the following teachings, a multiplicity of suitable alternative implementation details.

Embodiments of the present invention present means and methods for protecting devices. Some embodiments may be designed to protect electronic devices. However, alternative embodiments may be used to protect any kind of device.

Figure 1:
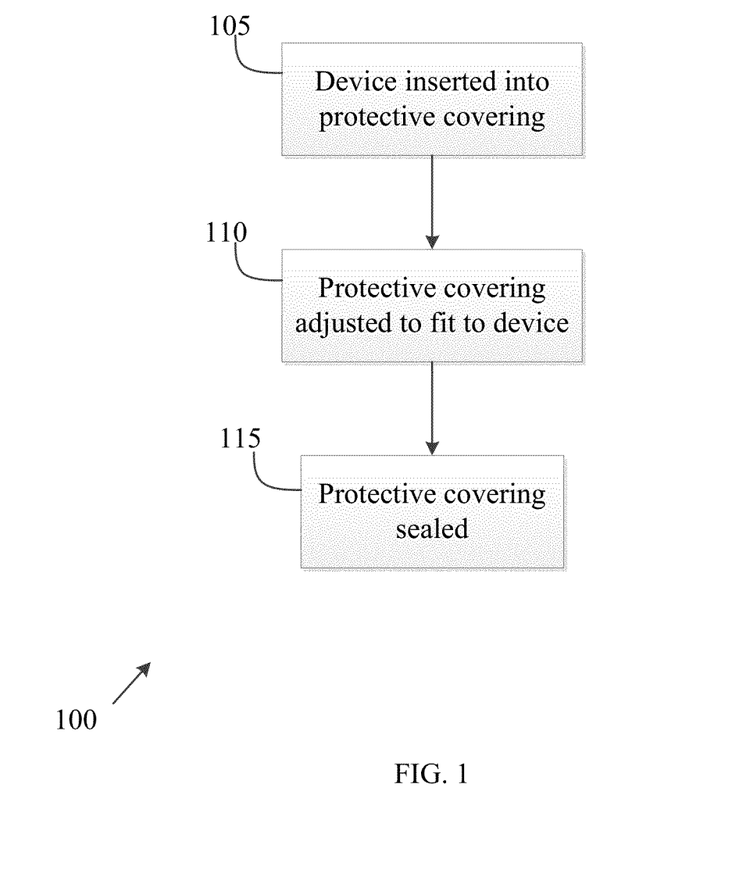
FIG. 1 illustrates an exemplary method for protecting devices, in accordance with an embodiment of the present invention.

FIG. 1 illustrates an exemplary method for protecting devices, in accordance with an embodiment of the present invention. In the present embodiment, users may insert a device into a protective covering in a step 105. In alternative embodiments, users may fit a protective covering around a device. In other alternative embodiments, users may insert multiple devices into a single protective covering. In still other alternative embodiments, multiple protective coverings may be joined or otherwise used in conjunction to protect one or more devices. In yet other alternative embodiments, users may fit a single protective covering or multiple protective coverings around multiple devices. In the present embodiment, users may adjust the protective covering to fit to one or more electronic devices in a step 110. Users may seal the protective covering in a step 115.

Figure 2:
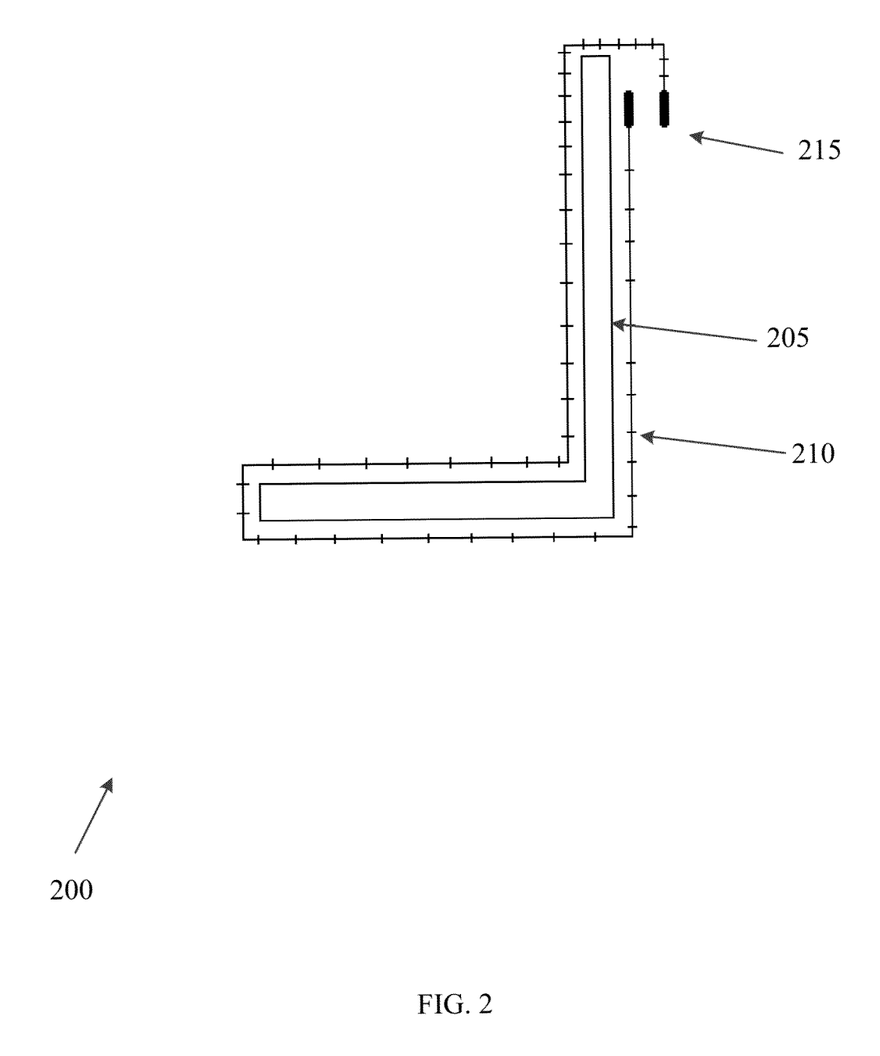
FIG. 2 illustrates an exemplary apparatus for protecting devices, in accordance with an embodiment of the present invention.

FIG. 2 illustrates an exemplary apparatus for protecting devices, in accordance with an embodiment of the present invention. In the present embodiment, a laptop device 205 may be protected by a protective covering 210. In other embodiments, protected devices may include, without limitation, cell phones, tablets, all-in-one computers, etc. In some embodiments, the protective covering 210 may be composed of a substantially transparent material to allow users to view the protected device 205. In alternative embodiments, the protective covering 210 may be composed of non-transparent materials. In other alternative embodiments, the protective covering 210 may be composed of both transparent and non-transparent materials. In some embodiments, the protective covering 210 may be suitable to protect against electro-magnetic pulses or solar flares. In some of these embodiments, the protective covering 210 may be composed of a conductive material or a combination of multiple conductive materials. In other embodiments, the protective covering may be composed of materials coated/plated by other materials. In a non-limiting example, a protective covering 210 may be substantially composed of stainless steel and coated/plated/electroplated in other materials such as, without limitation, nickel, tin, copper, and/or silver. In alternative embodiments copper mesh may be used. In alternative embodiments, the protective covering 210 may be suitable to protect against other unwanted agents, including, without limitation, heat, cold, particles, fluids, objects, etc. In some embodiments, the protective covering 210 may be designed to allow heat to dissipate through the protective covering 210. In a non-limiting example, the protective covering 210 may be a wire mesh. In the present non-limiting example, the wire mesh may have between 60-120, or approximately 100-105 openings per linear inch ideally to minimize visual distortion. In the present non-limiting example, the mesh is comprised of 105 OPI, Stainless Steel 304 mesh. In other embodiments other mesh types may be suitable. In a non-limiting example, this mesh is cut at a 45 degree angle to prevent Moire pattern effect, and then it is stitched on the sides. At the top and bottoms of the mesh, the mesh is looped around itself and stitched to create a pocket for magnetic strips that then connect to each other. In some embodiments different coated meshes may be stitched together. Additionally, transparent conductive plastic could be used to substitute for the mesh portion covering the screen. In alternative embodiments, any number of openings may be suitable. In the present embodiment, the protective covering 210 may have a sealing means 215. In some embodiments, the protective covering may have one opening. In some of these embodiments, a single sealing means 215 may be used. In alternative embodiments, the protective covering 210 may have multiple openings. In some of these alternative embodiments, the protective covering 210 may have multiple sealing means 215. In a non-limiting example, the sealing means 215 may be composed of a magnetic seal. In the present non-limiting example, the magnetic seal 215 may be comprised of magnetic strips attached to the protective covering 210. Magnetic strips and any other sealing means 215 may be attached to the protective covering 210 by means of, without limitation, gluing or sewing. In other embodiments, the sealing means 215 may be comprised of, without limitation, clamps, adhesive tape, magnets used in conjunction with a suitable metal, Velcro, and other magnetic and/or sealing means. In many embodiments, materials used in the sealing means 215 may be reusable. Embodiments of the present invention, provide transparency around a computer screen, flexibility enough to type through it, a seal to stop outside frequencies, a material that blocks electro-magnetic fields/electro-magnetic pulses EMF/EMP, and permeability to allow waste heat to dissipate. Embodiments of the present invention provide solution that is light, inexpensive, and easy to use. Embodiments may also allow wireless signals through the mesh, and reduce a electronic emissions.

Figure 3:
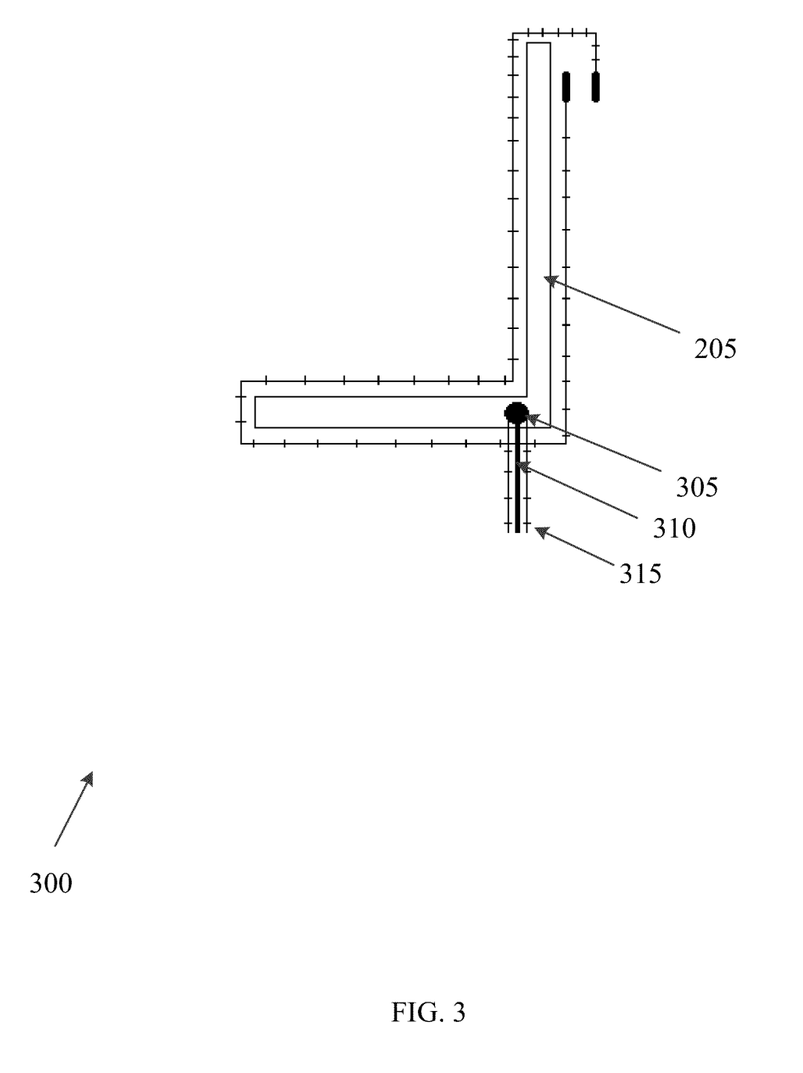
FIG. 3 illustrates an exemplary apparatus for protecting devices that allows plugs and other attachments, in accordance with an embodiment of the present invention.

FIG. 3 illustrates an exemplary apparatus for protecting devices that allows plugs and other attachments, in accordance with an embodiment of the present invention. In the present embodiment, a plug 305 with a conductive gasket 310 may be attached to a laptop device 205. The gasket 310 may be a conductive funnel shape that is wider than the diameter of the power cable. The mesh 210 may be glued, taped, or otherwise attached to the funnel. In some embodiments, gasket 310 may have a screw top made of the same material. This allows a screw to be attached to the top and seal the protective covering, or also allow a conductive tube that will contain the power or other cables to be screwed on. The tubing or conductive material may be sized to contain laptop adapters, with a different screw top piece at the end. This may allow the tubing or mesh to be connected to another protected (power) system, with no EMP interference. The protective covering 210 may have suitable openings and/or protective tubing 315 to protect the plug 305 and/or the conductive gasket 310. In other embodiments, the protective covering 210 may have multiple openings to allow other inputs or attachments to the device 205, including, without limitation, wired mouse cables. The protective tubing 315 may be composed of identical material to the protective covering 210 or different materials. The opening and/or protective tubing 315 may be sealed when not in use. In a non-limiting example, the opening and/or protective tubing 315 may be sealed through use of, without limitation, mechanical force, magnetic components, and/or bending.

In some embodiments, the protective covering 210 may be sufficiently flexible to allow manipulation of enclosed devices. In a non-limiting example, a protective covering 210 around a laptop device 205 may be sufficiently flexible to allow a user to type on a keyboard attached to the laptop device 205. In other embodiments, the protective covering 210 may allow users to use wireless devices, such as, without limitation, keyboards and/or mice in conjunction with a device. In many embodiments in which electronic devices may be used, any wireless signals and/or Wi-Fi may be transmitted through the protective covering 210. In some embodiments, the protective covering 210 may be sized to be substantively bigger than a device to be protected. In alternative embodiments, the protective covering 210 may fit tightly on a device.

In other embodiments, the protective covering 210 may stitch to itself to cover any sharp edges. In a non-limiting example, adhesive tape, a fabric border, or any material that is solid enough and can bend around the edges may be used to cover sharp edges of a device.

In still other embodiments, the protective covering 210 may be rotated from a straight orientation to prevent adverse effects. In a non-limiting example in which a laptop device may be used, protective covering material in front of a screen of the laptop device may be rotated 15 to 75 degrees from a straight orientation to either side in order to prevent a Moiré effect. In the present non-limiting example, a rotation of 45 degrees may be a suitable angle to minimize disruption. In other embodiments, the protective covering 210 may be suspended a suitable distance from a screen of a device to prevent the Moiré effect.

Figure 4:
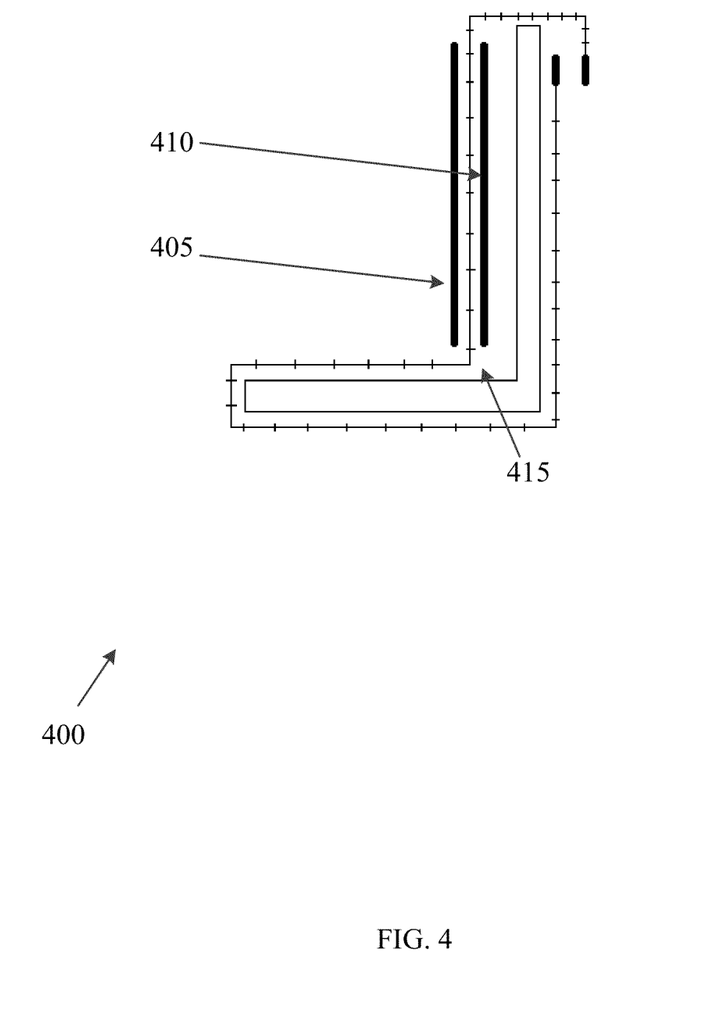
FIG. 4 illustrates an apparatus for protecting devices that incorporates a means of flattening the protective covering, in accordance with an embodiment of the present invention.

FIG. 4 illustrates an apparatus for protecting devices that incorporates a means of flattening the protective covering, in accordance with an embodiment of the present invention. The flattening means may optionally improve viewing of a screen of device 205. In the present embodiment, a first flattening means 405 may be situated outside the protective covering 210 in relation to the device 205. In some embodiments, the first flattening means 405 may flatten the protective covering 210 against a screen of the device 205. In other embodiments, a second flattening means 410 may be used. The protective covering 210 may be situated between the first flattening means 405 and the second flattening means 410. Flattening means may be attached to the protective covering 210 and/or the device 205 by any fastening means, including, without limitation, glue. In a non-limiting example, flattening means may be an acrylic screen. In at least some embodiments, flattening means may be composed of transparent or near-transparent material. In some embodiments, the second flattening means may be suitable to prevent scratching or other damage to a screen or display of the device 205. In some embodiments, a substantially wide gap 415 between the flattening means 405 and the device 205 may allow users to access components of the device 205. In a non-limiting example in which a laptop device may be used, a gap 415 may allow users to access a keyboard on the laptop device 205.

Figure 5:
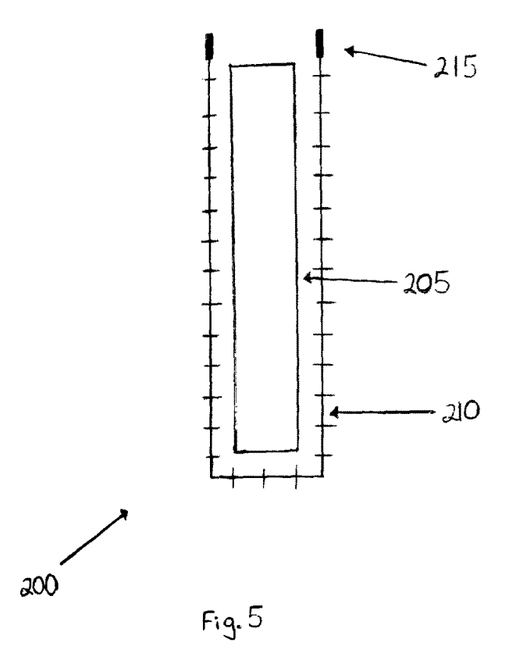
FIG. 5 illustrates an apparatus for protecting devices, in accordance with an embodiment of the present invention.

FIG. 5 illustrates an apparatus for protecting devices, in accordance with an embodiment of the present invention. In the present embodiment, a laptop device 205 may be protected by a protective covering 210, and the protective covering 210 may have a sealing means 215, for example without limitation, a magnetic strip. The device in the present embodiment is similar to the device illustrated by way of example in FIG. 2 with the exception of the placement of the sealing means 215. The sealing means 215 in the present embodiment is placed at the top of the enclosure rather than behind the viewing screen. This may optimize the ability for users to place electronic devices within the protecting device that do not "fold" as a laptop typically does such as, but not limited to, tablets.

Some embodiments of the present invention may be suitably lightweight so as to be portable. In some of these embodiments, carrying means may be incorporated to improve portability. Various carrying means may include, without limitation, straps, zippers, or other auxiliary devices. Some embodiments may be folded directly or rolled around a tube-shaped object and carried. Other alternate designs may incorporate a rigid frame like a lattice or metal bar grid in conjunction with the part of the mesh that is in under and behind the electronic device. When folded, the computer's weight would be distributed on the frame. Straps may be attached, if the frame is outside the mesh, directly to the frame.

In some embodiments, shielded ports may be incorporated. In other embodiments, a filtered antenna for use with satellite uplinks may be incorporated. In still other embodiments, a filter may be incorporated to shield for filtering power cable energy. In some embodiments shielded ports and other connections may be done either in the same manner as the power cable was treated above, or, filters may be added. Holes may be cut in the mesh and the filters may be glued onto the mesh. In some embodiments an antenna may be combined to a filter which would be attached, in a similar manner as the power cable connection above.

In other embodiments, the protective covering 210 may be in the form of a containment box with a substantially transparent screen. In a non-limiting example, the containment box may be composed of aluminum or any conductive material and the substantially transparent screen may be composed of metallic mesh.

In still other embodiments, portions of the protective covering may be secured in place by means of a lid stay. In a non-limiting example, a bar may be used to secure a flattening means 405 in place.

Those skilled in the art will readily recognize, in light of and in accordance with the teachings of the present invention, that any of the foregoing steps may be suitably replaced, reordered, removed and additional steps may be inserted depending upon the needs of the particular application. Moreover, the prescribed method steps of the foregoing embodiments may be implemented using any physical and/or hardware system that those skilled in the art will readily know is suitable in light of the foregoing teachings. For any method steps described in the present application that can be carried out on a computing machine, a typical computer system can, when appropriately configured or designed, serve as a computer system in which those aspects of the invention may be embodied. Thus, the present invention is not limited to any particular tangible means of implementation.

All the features disclosed in this specification, including any accompanying abstract and drawings, may be replaced by alternative features serving the same, equivalent or similar purpose, unless expressly stated otherwise. Thus, unless expressly stated otherwise, each feature disclosed is one example only of a generic series of equivalent or similar features.

It is noted that according to USA law 35 USC §112 (1), all claims must be supported by sufficient disclosure in the present patent specification, and any material known to those skilled in the art need not be explicitly disclosed. However, 35 USC §112 (6) requires that structures corresponding to functional limitations interpreted under 35 USC §112 (6) must be explicitly disclosed in the patent specification. Moreover, the USPTO's Examination policy of initially treating and searching prior art under the broadest interpretation of a "mean for" claim limitation implies that the broadest initial search on 112(6) functional limitation would have to be conducted to support a legally valid Examination on that USPTO policy for broadest interpretation of "mean for" claims. Accordingly, the USPTO will have discovered a multiplicity of prior art documents including disclosure of specific structures and elements which are suitable to act as corresponding structures to satisfy all functional limitations in the below claims that are interpreted under 35 USC §112 (6) when such corresponding structures are not explicitly disclosed in the foregoing patent specification. Therefore, for any invention element(s)/structure(s) corresponding to functional claim limitation(s), in the below claims interpreted under 35 USC §112 (6), which is/are not explicitly disclosed in the foregoing patent specification, yet do exist in the patent and/or non-patent documents found during the course of USPTO searching, Applicant(s) incorporate all such functionally corresponding structures and related enabling material herein by reference for the purpose of providing explicit structures that implement the functional means claimed. Applicant(s) request(s) that fact finders during any claims construction proceedings and/or examination of patent allowability properly identify and incorporate only the portions of each of these documents discovered during the broadest interpretation search of 35 USC §112 (6) limitation, which exist in at least one of the patent and/or non-patent documents found during the course of normal USPTO searching and or supplied to the USPTO during prosecution. Applicant(s) also incorporate by reference the bibliographic citation information to identify all such documents comprising functionally corresponding structures and related enabling material as listed in any PTO Form-892 or likewise any information disclosure statements (IDS) entered into the present patent application by the USPTO or Applicant(s) or any $3^{rd}$ parties. Applicant(s) also reserve its right to later amend the present application to explicitly include citations to such documents and/or explicitly include the functionally corresponding structures which were incorporate by reference above.

Thus, for any invention element(s)/structure(s) corresponding to functional claim limitation(s), in the below claims, that are interpreted under 35 USC §112 (6), which is/are not explicitly disclosed in the foregoing patent specification, Applicant(s) have explicitly prescribed which documents and material to include the otherwise missing disclosure, and have prescribed exactly which portions of such patent and/or non-patent documents should be incorporated by such reference for the purpose of satisfying the disclosure requirements of 35 USC §112 (6). Applicant(s) note that all the identified documents above which are incorporated by reference to satisfy 35 USC §112 (6) necessarily have a filing and/or publication date prior to that of the instant application, and thus are valid prior documents to incorporated by reference in the instant application.

Having fully described at least one embodiment of the present invention, other equivalent or alternative methods of implementing device protection according to the present invention will be apparent to those skilled in the art. Various aspects of the invention have been described above by way of illustration, and the specific embodiments disclosed are not intended to limit the invention to the particular forms disclosed. The particular implementation of the device protection may vary depending upon the particular context or application. By way of example, and not limitation, the device protection described in the foregoing were principally directed to electronic device implementations; however, similar techniques may instead be applied to any kind of devices, which implementations of the present invention are contemplated as within the scope of the present invention. The invention is thus to cover all modifications, equivalents, and alternatives falling within the spirit and scope of the following claims. It is to be further understood that not all of the disclosed embodiments in the foregoing specification will necessarily satisfy or achieve each of the objects, advantages, or improvements described in the foregoing specification.

Claim elements and steps herein may have been numbered and/or lettered solely as an aid in readability and understanding. Any such numbering and lettering in itself is not intended to and should not be taken to indicate the ordering of elements and/or steps in the claims.

The corresponding structures, materials, acts, and equivalents of all means or step plus function elements in the claims below are intended to include any structure, material, or act for performing the function in combination with other claimed elements as specifically claimed.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising:
    a protective covering, said protective covering comprising at least one electrically conductive sheet material, in which;
        said at least one electrically conductive sheet material comprising a substantially transparent material, said transparent sheet material is operable to enable users to view a protected computing device;
        said at least one electrically conductive sheet material further comprising a substantially flexible sheet material, said flexible sheet material being configured to fold to comprise at least a pouch structure, in which said pouch structure comprises at least one opening and being configured to substantially enclose said protected computing device, wherein said flexible sheet material is operable to enable said pouch structure to generally conform to a shape of said protected computing device;
        said at least one electrically conductive sheet material further comprising at least a wire mesh material, said wire mesh material comprising a wire mesh having a cut or tilt of approximately forty (45) degrees angle, wherein said angle is configured to reduce, if not substantially prevent, a Moire pattern effect on said pouch structure;
        said at least one electrically conductive sheet material further comprising at least one pair of magnetic strip pockets, wherein said pockets encloses magnetic strips, said pair of magnetic strip pockets is generally disposed at side edge portions of said pouch structure, wherein said pair of magnetic strip pockets being operable to seal said side edge portions of said pouch structure; and
        said at least one pair of magnetic strip pockets is a sealing member, said sealing member being configured to close an opening of said pouch structure to substantially enclose the portable computing device within said pouch structure, said closure member being further configured to create an electrical engagement across said opening of said pouch structure in which said closed pouch structure substantially mitigates electro-magnetic pulse damage to the enclosed portable computing device, enables viewing of displays of the enclosed portable computing device, and enables manipulation of controls of the enclosed portable computing device.

2. The apparatus as recited in claim 1, in which said mesh material being configured to pass heat from the portable computing device, and in which said substantially transparent material is a combination of transparent and non-transparent materials.

3. The apparatus as recited in claim 2, in which said mesh material comprises a stainless steel core material, in which said stainless steel is substantially coated with nickel, tin, copper or silver.

4. The apparatus as recited in claim 2, in which at least a portion of said mesh material is coated.

5. The apparatus as recited in claim 2, in which said mesh material comprises approximately 60 to 120 openings per linear inch, said openings being configured to substantially minimize visual distortion.

6. The apparatus as recited in claim 2, in which a fabric of said mesh material is oriented at approximately 45 degrees angle relative to display of said enclosed protected computing device to substantially mitigate said Moire pattern effect.

7. The apparatus as recited in claim 1, in which said sealing member comprises at least two or more pairs of magnetic strips in engagement with said side edge portions of said opening, configured to close an opening of said pouch structure.

8. The apparatus as recited in claim 1, in which said protective covering further comprising at least one plug, said plug comprise of a gasket in engagement with said at least one electrically conductive sheet material, said gasket being configured to pass an electrical cord of the portable computing device, wherein a diameter of said gasket is substantially wider than a diameter of said electrical cord.

9. The apparatus as recited in claim 8, in which said gasket comprise of a screw top, said gasket further comprising a protective tubing in engagement with said gasket for shielding said electrical cord, wherein said screw top is configured to enable said protective tubing to be screwed on.

10. The apparatus as recited in claim 1, further comprising at least one transparent ridged sheet being in engagement with said at least one electrically conductive sheet material for generally flattening said at least one electrically conductive sheet material in general proximity of a display of the enclosed portable computing device.

11. The apparatus as recited in claim 10, further comprising an additional transparent ridged sheet generally forming a sandwich with said at least one transparent ridged sheet and said at least one electrically conductive sheet material.

12. The apparatus as recited in claim 1, in which said at least one electrically conductive sheet material is further configured to generally pass wireless communication signals.

13. An apparatus consisting of:
  means for generally forming an electrically conductive pouch structure having a substantial transparency, being configured to generally pass wireless communication signals and being configured for substantially enclosing a portable computing device;
  means for substantially reducing a Moire pattern effect on said means for enclosing a portable computing device;
  means for screwing on a shield of an electrical cord of said portable computing device, said shielding means being in engagement with said enclosing means;
  means for passing an electrical cord of said portable computing device; and
  means for closing an opening of said pouch structure for substantially enclosing the portable computing device within said pouch structure, said closure member being further configured for generally creating an electrical engagement across said opening of said pouch structure in which said closed pouch structure substantially mitigates electro-magnetic pulse damage to the enclosed portable computing device, enables viewing of displays of the enclosed portable computing device, and enables manipulation of controls of the enclosed portable computing device, and substantially passes heat from the enclosed portable computing device.

14. The apparatus as recited in claim 13, further comprising means for passing an electrical cord of the portable computing device through said pouch structure.

15. The apparatus as recited in claim 14, further comprising means for shielding the electrical cord.

16. The apparatus as recited in claim 13, further comprising means for flattening said pouch structure in proximity of displays of the enclosed portable computing device.

17. An apparatus comprising:
  a protective covering, said protective covering comprises at least one electrically conductive sheet material, in which;
  said at least one electrically conductive sheet material comprising a stainless steel mesh material, said mesh material comprising approximately 60 to 120 openings per linear inch, said mesh material openings being configured to minimize visual distortion, said at least one sheet material having a substantial transparency and being configured to generally pass wireless communication signals, said at least one sheet material is a flexible sheet material being configured to fold to form a pouch structure, said pouch structure being configured to substantially enclose a portable computing device, in which a fabric of said mesh material is oriented at approximately forty (45) degrees angle relative to a display of said enclosed portable computing device to substantially mitigate a Moire pattern effect;
  a sealing member being configured to generally close an opening of said pouch structure to substantially enclose the portable computing device within said pouch structure, said sealing member comprising a pair of magnetic strips in engagement with side edge portions of said pouch structure opening, said sealing member being further configured to generally create an electrical engagement across said opening of said pouch structure in which said closed pouch structure substantially mitigates electro-magnetic pulse damage to the enclosed portable computing device, enables viewing of displays of the enclosed portable computing device, enables manipulation of controls of the enclosed portable computing device, and substantially passes heat from the enclosed portable computing device; and
  a plug, said plug comprising a gasket in engagement with said at least one electrically conductive sheet material, said gasket comprising protective tubing portions being configured to pass an electrical cord of the portable computing device, wherein a diameter of said gasket is substantially wider than a diameter of said electrical cord.

18. The apparatus as recited in claim 17, further comprising at least one plug, said at least one plug comprising a gasket in engagement with said at least one electrically conductive sheet material, said gasket being configured to pass an electrical cord of the portable computing device, wherein a diameter of said gasket is substantially wider than a diameter of said electrical cord.

19. The apparatus as recited in claim 18, further comprising a protective tubing in engagement with said gasket for substantially shielding the electrical cord.

20. The apparatus as recited in claim 17, further comprising at least one transparent ridged sheet being in engagement with said at least one electrically conductive sheet material for generally flattening said at least one electrically conductive sheet material in proximity of a display of the enclosed portable computing device.

* * * * *